United States Patent
Verma et al.

(10) Patent No.: US 11,411,573 B2
(45) Date of Patent: Aug. 9, 2022

(54) CMOS RF POWER DETECTOR UTILIZED BY COUPLED LINE, SQUARER, AND CURRENT MODE SAR ADC

(71) Applicant: Samsung Electronics Co., Ltd., Gyeonggi-do (KR)

(72) Inventors: Ashutosh Verma, Santa Clara, CA (US); Fan Zhang, San Jose, CA (US)

(73) Assignee: Samsung Electronics Co., Ltd.

(*) Notice: Subject to any disclaimer, the term of this patent is extended or adjusted under 35 U.S.C. 154(b) by 0 days.

(21) Appl. No.: 17/164,406

(22) Filed: Feb. 1, 2021

(65) Prior Publication Data
US 2022/0069835 A1 Mar. 3, 2022

Related U.S. Application Data

(60) Provisional application No. 63/073,674, filed on Sep. 2, 2020.

(51) Int. Cl.
*H03M 1/12* (2006.01)
*H03M 1/46* (2006.01)
*G01R 21/133* (2006.01)

(52) U.S. Cl.
CPC .......... *H03M 1/462* (2013.01); *G01R 21/133* (2013.01); *H03M 1/1245* (2013.01)

(58) Field of Classification Search
CPC .... H03M 1/452; H03M 1/1245; G01R 21/133
USPC .......... 341/120, 118, 155, 144, 163
See application file for complete search history.

(56) References Cited

U.S. PATENT DOCUMENTS

| | | | | |
|---|---|---|---|---|
| 6,141,538 A | * | 10/2000 | Consolazio | H04B 1/40 455/118 |
| 8,373,487 B1 | | 2/2013 | Roger | |
| 9,595,974 B1 | | 3/2017 | Pereira et al. | |
| 10,135,472 B1 | * | 11/2018 | Ashry Othman | H04B 1/0475 |
| 2009/0281741 A1 | * | 11/2009 | van Zyl | G01R 19/0007 702/60 |
| 2013/0316657 A1 | * | 11/2013 | Chen | H04B 17/318 455/67.13 |
| 2016/0329972 A1 | * | 11/2016 | Dominizi | H04B 17/21 |

FOREIGN PATENT DOCUMENTS

EP 2403146 1/2012

OTHER PUBLICATIONS

Y. Zhou et al., "A Low-Power Ultra-Wideband CMOS True RMS Power Detector," in IEEE Transactions on Microwave Theory and Techniques, vol. 56, No. 5, pp. 1052-1058, May 2008, doi: 10.1109/TMTT.2008.921299.

K. A. Townsend et al., "A Wideband Power Detection System Optimized for the UWB Spectrum," in IEEE Journal of Solid-State Circuits, vol. 44, No. 2, pp. 371-381, Feb. 2009, doi: 10.1109/JSSC.2008.2011032.

(Continued)

*Primary Examiner* — Peguy Jean Pierre
(74) *Attorney, Agent, or Firm* — The Farrell Law Firm, P.C.

(57) ABSTRACT

An electronic device and method are provided. The electronic device includes a directional coupler, a sense pair connected to the directional coupler, and an analog-to-digital converter (ADC) connected to the sense pair. The ADC directly digitizes a signal current received from the sense pair.

18 Claims, 7 Drawing Sheets

(56) References Cited

OTHER PUBLICATIONS

S. M. Bowers et al., "Integrated Self-Healing for mm-Wave Power Amplifiers," in IEEE Transactions on Microwave Theory and and Techniques, vol. 61, No. 3, pp. 1301-1315, Mar. 2013, doi: 10.1109/TMTT.2013.2243750.

T. Li, M. Huang et al., "Millimeter-Wave Continuous-Mode Power Amplifier for 5G MIMO Applications," in IEEE Transactions on Microwave Theory and Techniques, vol. 67, No. 7, pp. 3088-3098, Jul. 2019, doi: 10.1109/TMTT.2019.2906592.

J. Choi et al., "Wide Dynamic-Range CMOS RMS Power Detector," in IEEE Transactions on Microwave Theory and Techniques, vol. 64, No. 3, pp. 868-880, Mar. 2016, doi: 10.1109/TMTT.2016.2519030.

ETSI TS 138 101-2 V16.4.0 (Jul. 2020) 5G; NR; User Equipment (UE) radio transmission and reception; Part 2: Range 2 Standalone (3GPP TS 38.101-2 version 16.4.0 Release 16) pp. 172.

S. Cripps, "Coupler talk," in IEEE Microwave Magazine, vol. 7, No. 5, pp. 32-37, Oct. 2006, doi: 10.1109/MW-M.2006.247908.

\* cited by examiner

CMOS RF POWER DETECTOR UTILIZED BY COUPLED LINE, SQUARER, AND CURRENT MODE SAR ADC

PRIORITY

This application is based on and claims priority under 35 U.S.C. § 119(e) to U.S. Provisional Patent Application Ser. No. 63/073,674, filed on Sep. 2, 2020, the entire contents of which are incorporated herein by reference.

FIELD

The present disclosure is generally related to power detectors utilizing analog-to-digital (ADC) converters.

BACKGROUND

Antenna impedance variation severely impacts a power amplifier's (PA) output power and gain, especially PAs for 5G in millimeter wave. Complementary metal oxide semiconductor (CMOS) square outputs have been fed to a linear-to-log convertor followed by ADC. However, this requires extensive calibration and accuracy achieved is lower.

The fifth-generation (5G) wireless communication system is being rapidly adopted in a wide-range of promising applications, providing high-throughput and low-latency. In order to relieve the spectral congestion in the sub-6 GHz frequency range, the 5G FR2 standard extends cellular communication to the millimeter-wave frequencies (e.g., n257 (26.5-29.5 GHz), n258 (24.25-27.5 GHz), n261 (27.5-28.35 GHz)). Compared to a multi-mode CMOS radio frequency integrated circuit (RFIC) designed for previous generations (2/3/4G) of cellular standards, a single 5G mm-Wave CMOS phased-array front-end circuit (FE) requires multiple PAs operating simultaneously, resulting in high junction temperature (i.e., the on-chip junction temperature over 100° C. with 8 PAs turning on). Therefore, transmitter (TX) with high output delivered power over large temperature is a design challenge.

Accurate power control using power-detectors has been an important requirement for all generations of cellular transceivers. The requirements in 5G are unique because phased-array have multiple antennas and each power needs to be sensed, the coupler and the power detector (PDET) have to be integrated in CMOS, the PDET has to be small form factor to accommodate one instance per antenna, and the nominal operating temperature is higher.

SUMMARY

According to one embodiment, an electronic circuit includes a directional coupler, a sense pair connected to the directional coupler, and an ADC connected to the sense pair. The ADC directly digitizes a signal current received from the sense pair.

According to one embodiment, a method includes coupling, with a directional coupler, power delivered to an antenna to an input of a sense pair, converting, with the sense pair, the delivered power to direct current (DC) currents which indicate a power sensed at ports of the coupler, and directly digitizing, with an ADC, the converted currents from the sense pair.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Figure 1:
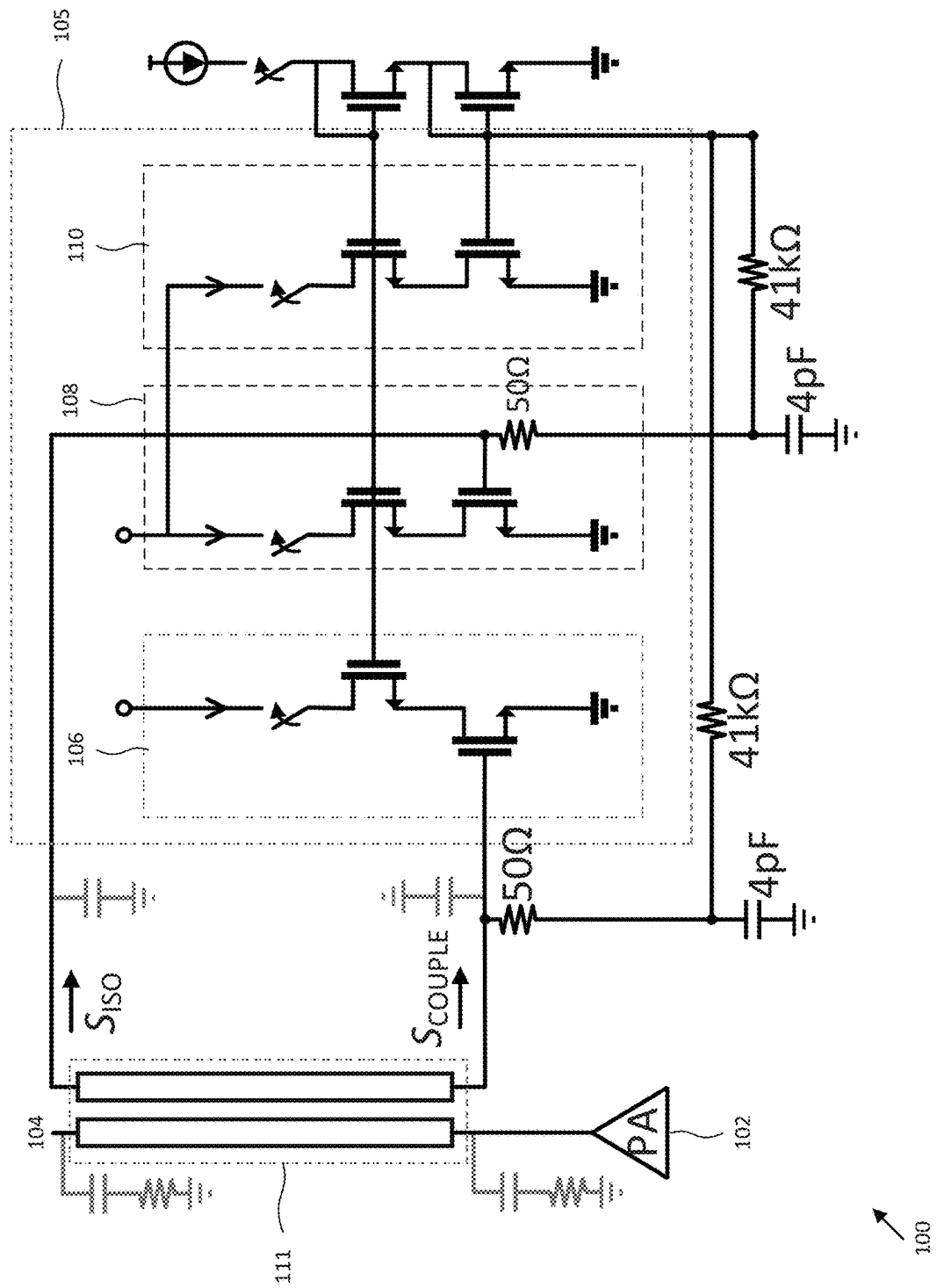
FIG. 1 illustrates a diagram of a coupled line power detector, according to an embodiment.

Hereinafter, embodiments of the present disclosure are described in detail with reference to the accompanying drawings. It should be noted that the same elements will be designated by the same reference numerals although they are shown in different drawings. In the following description, specific details such as detailed configurations and components are merely provided to assist with the overall understanding of the embodiments of the present disclosure. Therefore, it should be apparent to those skilled in the art that various changes and modifications of the embodiments described herein may be made without departing from the scope of the present disclosure. In addition, descriptions of well-known functions and constructions are omitted for clarity and conciseness. The terms described below are terms defined in consideration of the functions in the present disclosure, and may be different according to users, intentions of the users, or customs. Therefore, the definitions of the terms should be determined based on the contents throughout this specification.

The present disclosure may have various modifications and various embodiments, among which embodiments are described below in detail with reference to the accompanying drawings. However, it should be understood that the present disclosure is not limited to the embodiments, but includes all modifications, equivalents, and alternatives within the scope of the present disclosure.

Although the terms including an ordinal number such as first, second, etc. may be used for describing various elements, the structural elements are not restricted by the terms. The terms are only used to distinguish one element from another element. For example, without departing from the scope of the present disclosure, a first structural element may be referred to as a second structural element. Similarly, the second structural element may also be referred to as the first structural element. As used herein, the term "and/or" includes any and all combinations of one or more associated items.

The terms used herein are merely used to describe various embodiments of the present disclosure but are not intended to limit the present disclosure. Singular forms are intended to include plural forms unless the context clearly indicates otherwise. In the present disclosure, it should be understood that the terms "include" or "have" indicate existence of a feature, a number, a step, an operation, a structural element, parts, or a combination thereof, and do not exclude the existence or probability of the addition of one or more other features, numerals, steps, operations, structural elements, parts, or combinations thereof.

Unless defined differently, all terms used herein have the same meanings as those understood by a person skilled in the art to which the present disclosure belongs. Terms such as those defined in a generally used dictionary are to be interpreted to have the same meanings as the contextual meanings in the relevant field of art, and are not to be interpreted to have ideal or excessively formal meanings unless clearly defined in the present disclosure.

The electronic device according to one embodiment may be one of various types of electronic devices. The electronic devices may include, for example, a portable communication device (e.g., a smart phone), a computer, a portable multimedia device, a portable medical device, a camera, a wearable device, or a home appliance. According to one embodiment of the disclosure, an electronic device is not limited to those described above.

The terms used in the present disclosure are not intended to limit the present disclosure but are intended to include various changes, equivalents, or replacements for a corresponding embodiment. With regard to the descriptions of the accompanying drawings, similar reference numerals may be used to refer to similar or related elements. A singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, terms such as "1$^{st}$," "2nd," "first," and "second" may be used to distinguish a corresponding component from another component, but are not intended to limit the components in other aspects (e.g., importance or order). It is intended that if an element (e.g., a first element) is referred to, with or without the term "operatively" or "communicatively", as "coupled with," "coupled to," "connected with," or "connected to" another element (e.g., a second element), it indicates that the element may be coupled with the other element directly (e.g., wired), wirelessly, or via a third element.

As used herein, the term "module" may include a unit implemented in hardware, software, or firmware, and may interchangeably be used with other terms, for example, "logic," "logic block," "part," and "circuitry." A module may be a single integral component, or a minimum unit or part thereof, adapted to perform one or more functions. For example, according to one embodiment, a module may be implemented in a form of an application-specific integrated circuit (ASIC).

The present disclosure provides a current-mode ADC with a directly digitizing function, such that no voltage-to-current conversion errors occur and there is minimal temperature variation. A power detector directly digitizes the signal current from the CMOS squarer-based root-mean-square (RMS) detector without a current-to-voltage conversion, removing temperature dependency. In the current-mode ADC, large voltage swings at high impedance nodes are inputs to the comparator to reduce the comparator noise requirement. It also aids in closed-loop power control (CLPC), where the transmitted power is required to be in a specific range. The current-mirror is also programmable to reduce the dynamic-range requirement on the ADC. The present disclosure provides an ADC with low temperature dependency.

Figure 2:
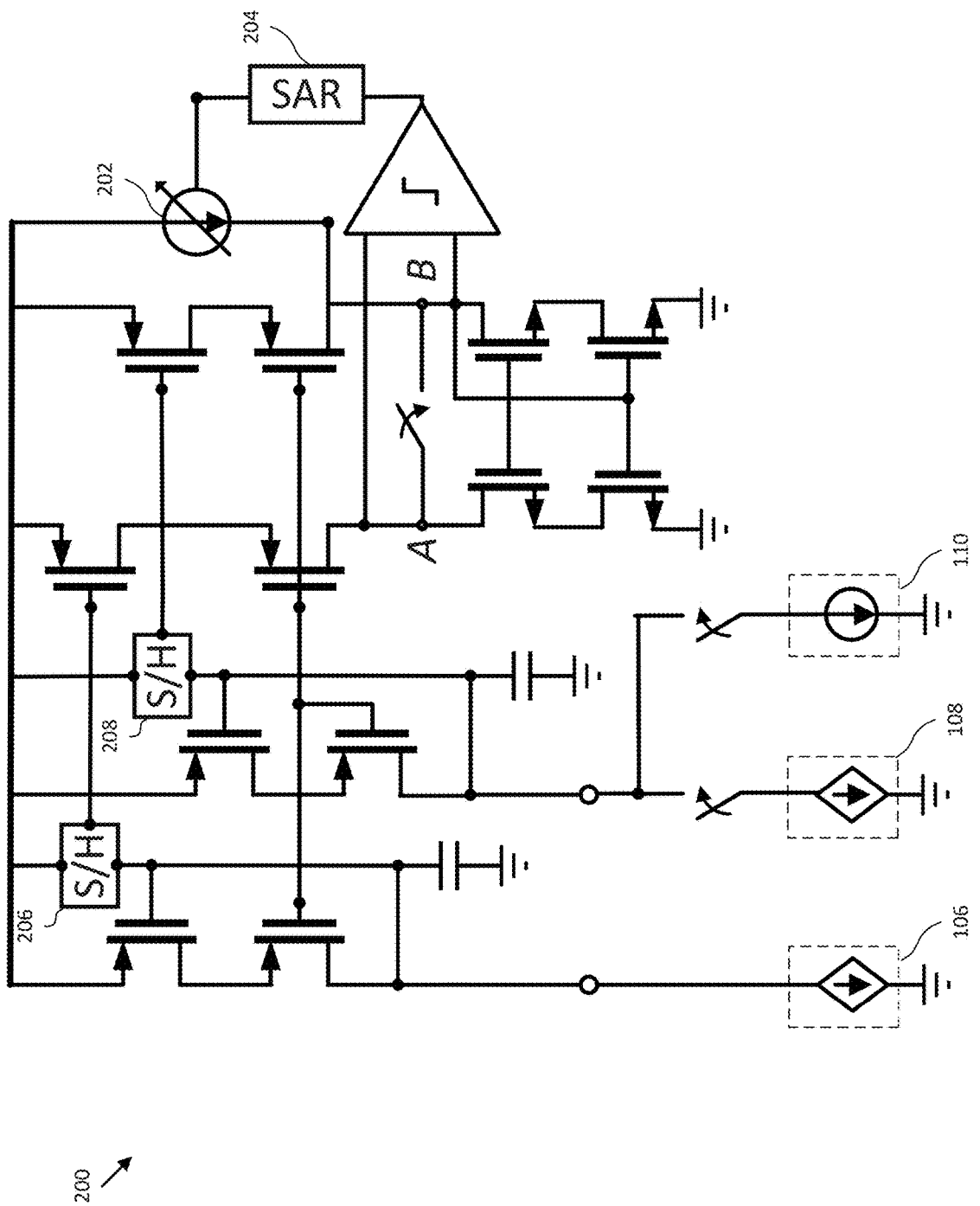
FIG. 2 illustrates a diagram of a current mode ADC, according to an embodiment.

FIG. 1 illustrates a diagram of a coupled line power detector, according to an embodiment. FIG. 2 illustrates a diagram of an ADC, according to an embodiment. The power detector 100 is connected with a PA 102, and includes an output 104, a sense pair 105 including a first sensing path 106, a second sensing path 108, and a reference path 110, a directional coupler 11, as well as an ADC (not shown). The coupler 11 couples the power delivered to the antenna to an input of the sense pair 105. The sense pair 105 converts the power at its input to DC currents, which indicate the power sensed at $b_{COUPLE}$ and $b_{ISO}$. The sensing path 106 may be used for $I_{COUPLE}$ sensing, and the sensing path 108 may be for $I_{ISO}$ (isolation) sensing. The difference of the power measured at the coupled and isolation ports ($|b_{COUPLE}|^2 - |b_{ISO}|^2$) improves power tracking in case of reduced directivity of the coupler or for high voltage standing wave ratio (VSWR) magnitude. The reference path 110 may be for $I_{DC}$ reference. The sensing paths 106 and 108, as well as the reference path 110 are connected to the ADC 200. The ADC may be a successive approximation register (SAR) ADC. The ADC 200 includes a digital-to-analog converter (DAC) 202, a SAR engine 204, sample-and-hold switched-caps 206 and 208, and voltage nodes A and B.

Antenna impedance variation severely impacts the PA output power and gain. The power detector 100 includes the pair of sensing paths 106 and 108, and a current-mode SAR ADC 200 for tracking PA output power variation with antenna VSWR.

Figure 3:
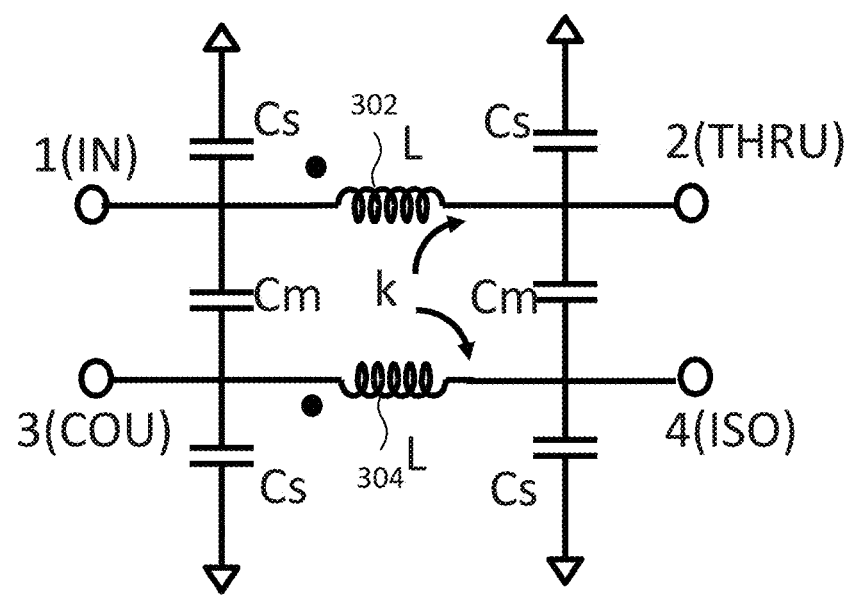
FIG. 3 illustrates a diagram of a directional coupler, according to an embodiment.

FIG. 3 illustrates a diagram of a directional coupler 300, according to an embodiment. A broad-side directional coupler 300 may be implemented at the PA 102 output for scaling down the signal to the linear range of the detector 100. The width, length and overlap of metal with parasitic capacitors Cs and Cm may be selected to equalize odd and even mode velocities which ensures a good isolation between coupled and isolated ports and consequently a high directivity. The coupler 300 shown in FIG. 3 models a short section (<<λ/4) of two coupled lines 302 and 304.

To further improve the output power tracking against VSWR, a pair of sensing paths 106 and 108 at both the coupled and isolated ports are used for measurement of the difference between the reflected waves at these ports ($|S_{COUPLE}|^2 - |S_{ISO}|^2$) and therefore the error caused by the reflected wave due to imperfect directivity can be significantly improved. DC current $I_{COUPLE}$ and $I_{ISO}$ indicating signal information ($S_{COUPLE}$ and $S_{ISO}$) are generated from the 2$^{nd}$-order nonlinearity of the device 100. The higher order frequency components may be filtered out. The drain signal current may be represented as Equation (1) below:

$$i_{DS} = \frac{\mu_n C_{ox}}{2} \frac{W}{L} (V_{GS} - V_t)^2 \quad (1)$$

where μn, Cox, and Vt are the electron mobility, gate-oxide capacitance per unit area, and threshold voltage, respectively. W and L are the width and length of the transistor. As described in Equation (1), $i_{DC}$ has a square-law relationship with the input RF signal, or gate-to-source voltage $V_{GS}$. By biasing the transistor in the right region of operation, the RF signal can be detected and linear-in-dB currents can be exported.

The dynamic range of the PDET is determined by the input-referred noise on the low end and the total harmonic distortion on the high end designed to measure a certain Pout range with ample margin for process/voltage/temperature (PVT) variations. DC offsets resulted from mismatch of the sense pair has to be calibrated prior to power measurements. The difference of the power measured at the coupled and isolation ports improves power tracking in case of reduced directivity of the coupler or for high VSWR magnitudes.

Figure 4:
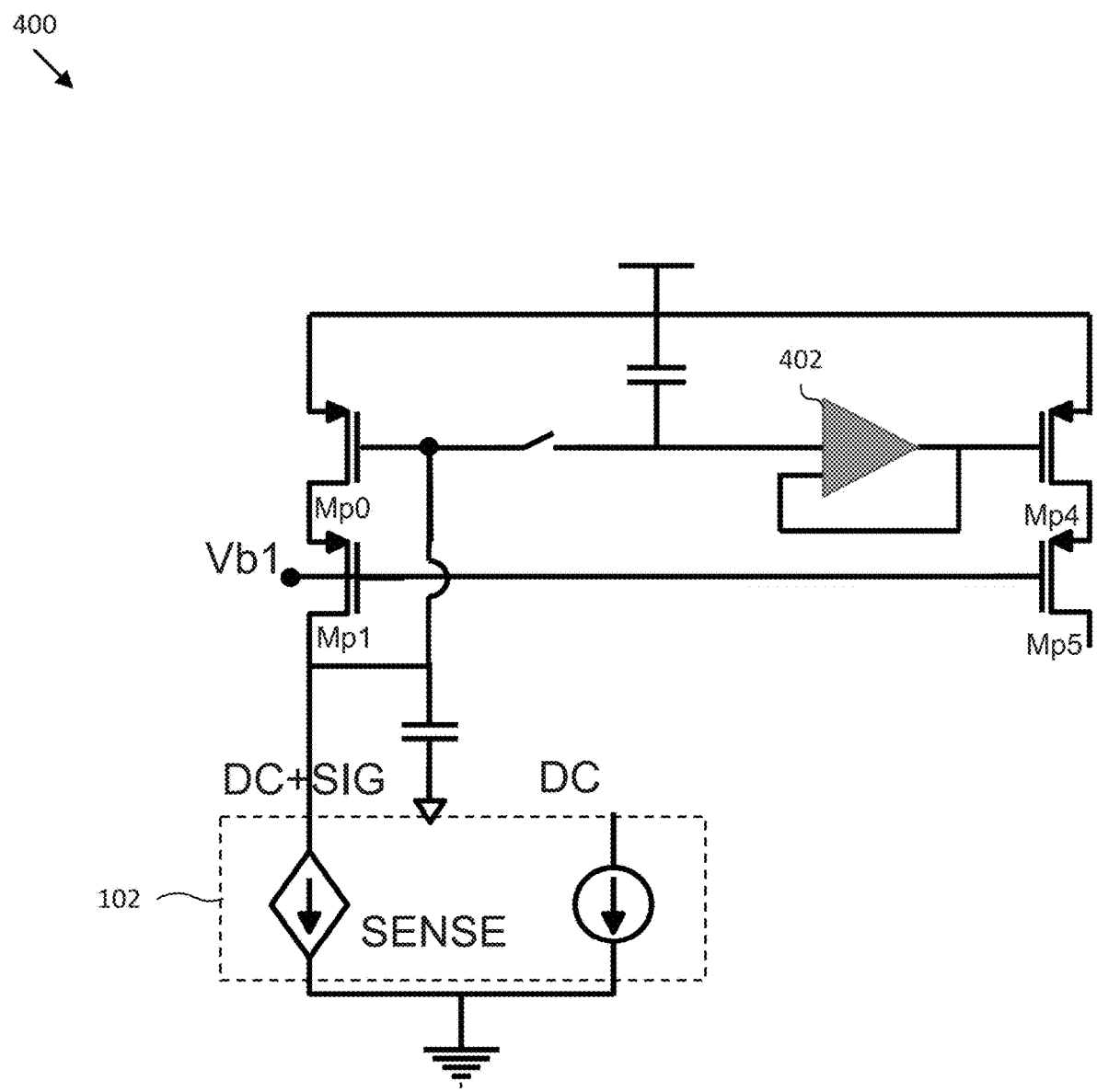
FIG. 4 illustrates a diagram of a sample-and-hold portion of an ADC, according to an embodiment.

The ADC 200 may be a 12-bits current-mode SAR ADC that digitizes a 30 dB range of DC current coming from the sensing paths 106 and 108 directly. Other bit resolutions may be utilized. Due to the benefit of directly digitizing the signal current without a current-to-voltage (I-to-V) conversion, this ADC 200 avoids the errors associated with I-to-V conversion and the process/temperature variation from diode linear-to-log conversion. Moreover, the temperature dependency is dominated by the device 100 and bias circuit only. The DAC 202 will be triggered by the SAR engine 204 to equalize the voltage delta of node A and B, which is mirroring the DC current. A 12-bit segmented DAC is used in this design with 7-bit thermometer most significant bit (MSB) DAC and a 5-bit binary least significant bit (LSB) DAC. This current-mode ADC 200 shows an effective number of bits (ENOB) of 10 bits and the DAC code represents the amplitude of signal from a directional coupler. Although 12-bit is utilized here, the disclosure may apply to any architecture applying a current mode ADC FIG. 4 illustrates a diagram of a sample-and-hold switched cap 400, according to an embodiment. The sample-and-hold switched cap 400 includes a unity-gain buffer 402 and is connected to a sense pair (e.g., sense pair 105 of FIG. 1). The sample-and-hold switched-cap is embedded in the current mirror, followed by a unity-gain buffer to improve the reverse isolation of the cascode current source and reduce sampling errors. The cascode current sources have finite reverse isolation. Therefore, there will be a large error in the sampled voltage once there're voltage changes on A&B. As a result, a unity-gain buffer 402 is added between the switch cap and the mirror gates. This isolates the sample and hold node from the gate of PMOS current mirror, resulting in much better reverse isolation. The sampled voltage doesn't change.

Figure 5:
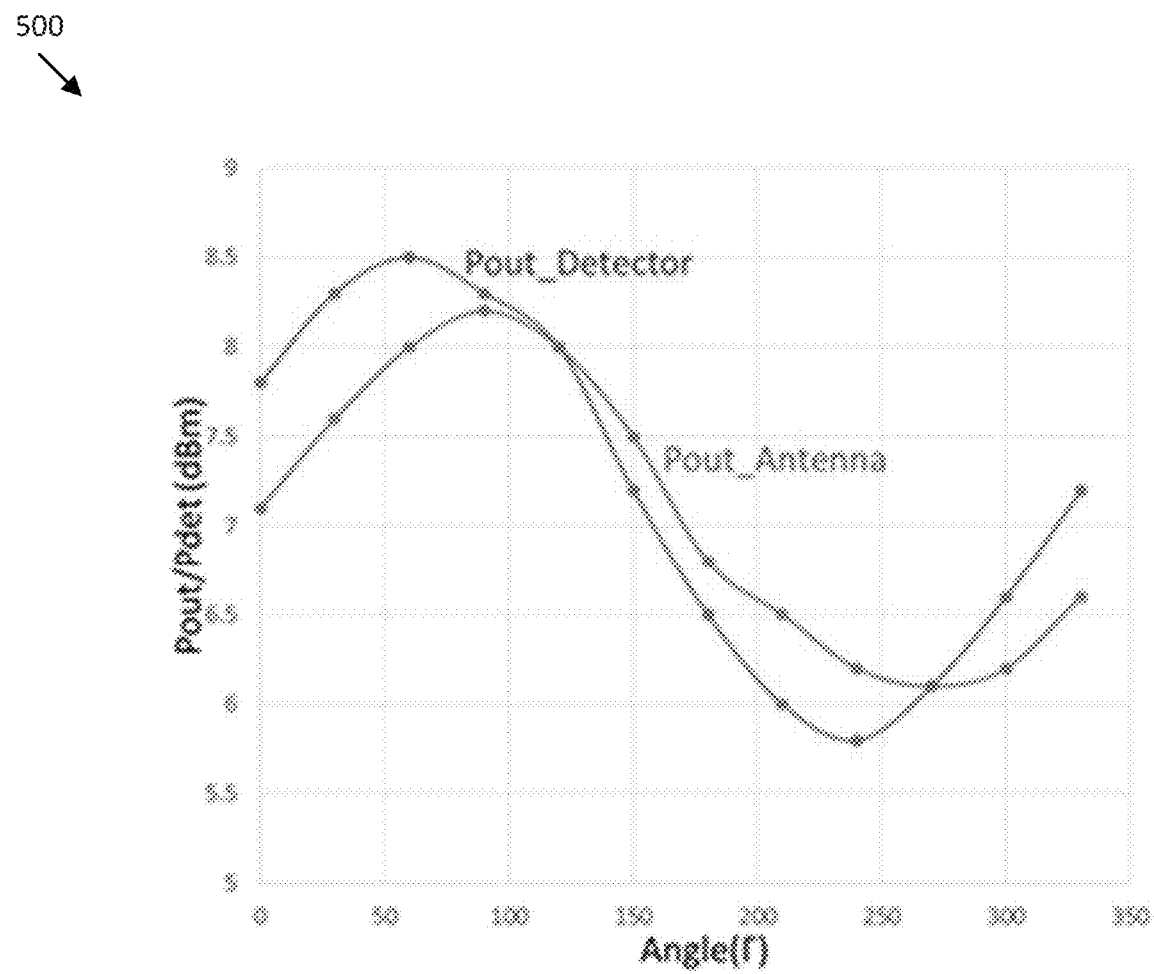
FIG. 5 illustrates a graph showing performance of a power detector, according to an embodiment.

FIG. 5 illustrates a graph 500 showing performance of a power detector, according to an embodiment. The data shown represents one example of the invention, but other variations may be utilized. Graph 500 depicts the measured accuracy of a detector, which shows the detected power and the measured output power against $\angle\Gamma$ for a VSWR of 2:1 at 26 GHz. Less than +/−1 dB error for a VSWR of 2:1 and less than +/−1.5 dB error for a VSWR of 3:1 across the 24-30 GHz frequency band at output power level of 12 dBm is shown. The measured $P_{out}$ of combining 5 paths of transmitters (TX) with respect to the DAC code is plotted with the temperature range from 5 to 85 degrees. The measurement results show very linear characteristic. The detection error stays well within +/−0.5 dB from combined effective isotropic radiated power (EIRP) of 10 to 30 dBm.

Figure 6:
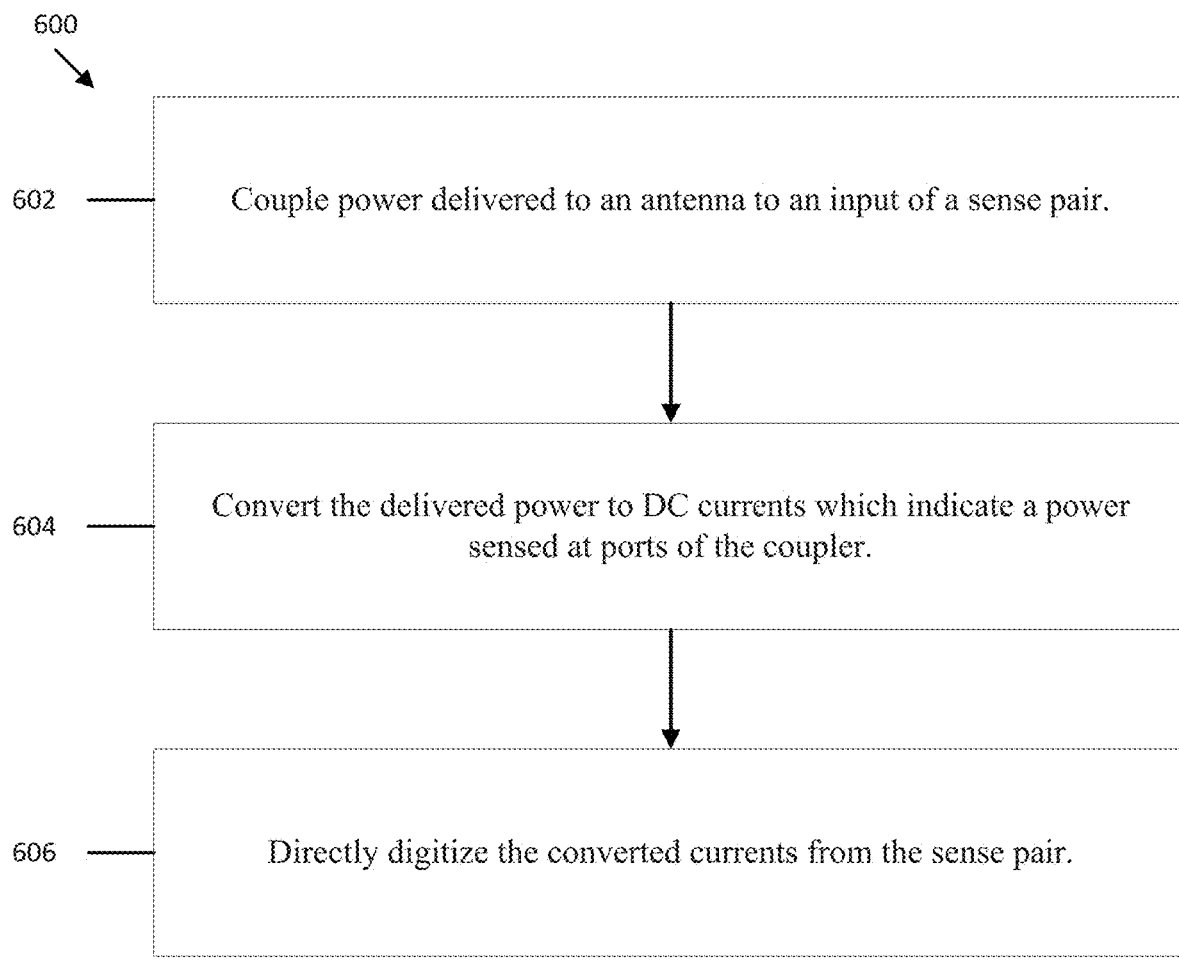
FIG. 6 illustrates a flowchart for a method of digitizing a signal current, according to an embodiment.

FIG. 6 illustrates a flowchart for a method of digitizing a signal current, according to an embodiment. At 602, the system couples, with a directional coupler, power delivered to an antenna to an input of a sense pair. At 604, the system converts, with the sense pair, the delivered power to DC currents which indicate a power sensed at ports of the coupler. At 606, the system directly digitizes, with an ADC, the converted currents from the sense pair. The disclosure herein is applicable to various environments and technology, including but not limited to phase arrays used in 5G mobile platforms, radars for vehicles, etc.

Figure 7:
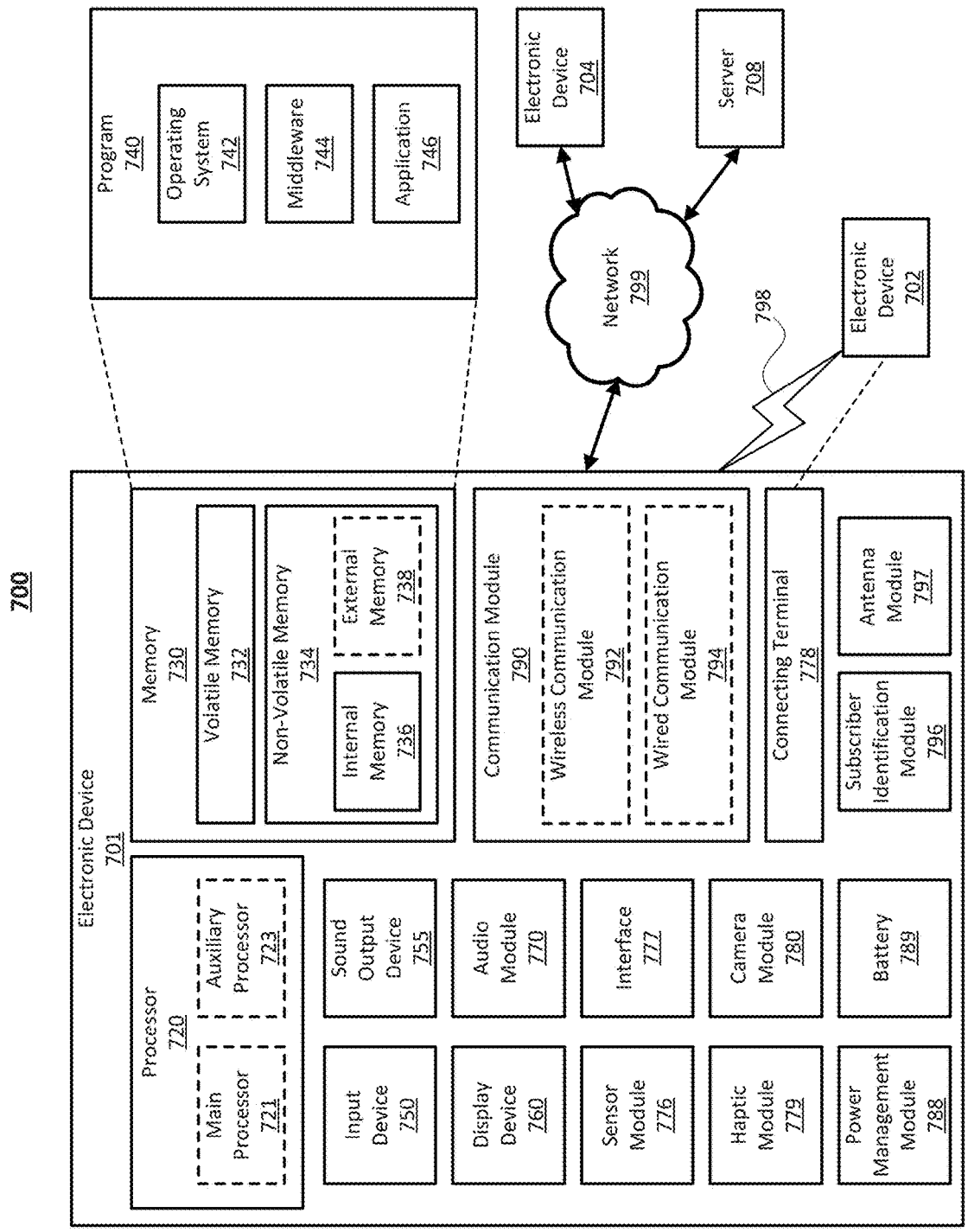
FIG. 7 illustrates a block diagram of an electronic device in a network environment, according to one embodiment.

FIG. 7 illustrates a block diagram of an electronic device 701 in a network environment 700, according to one embodiment. Referring to FIG. 7, the electronic device 701 in the network environment 700 may communicate with an electronic device 702 via a first network 798 (e.g., a short-range wireless communication network), or an electronic device 704 or a server 708 via a second network 799 (e.g., a long-range wireless communication network). The electronic device 701 may communicate with the electronic device 704 via the server 708. The electronic device 701 may include a processor 720, a memory 730, an input device 750, a sound output device 755, a display device 760, an audio module 770, a sensor module 776, an interface 777, a haptic module 779, a camera module 780, a power management module 788, a battery 789, a communication module 790, a subscriber identification module (SIM) 796, or an antenna module 797. In one embodiment, at least one (e.g., the display device 760 or the camera module 780) of the components may be omitted from the electronic device 701, or one or more other components may be added to the electronic device 701. In one embodiment, some of the components may be implemented as a single integrated circuit (IC). For example, the sensor module 776 (e.g., a fingerprint sensor, an iris sensor, or an illuminance sensor) may be embedded in the display device 760 (e.g., a display).

The processor 720 may execute, for example, software (e.g., a program 740) to control at least one other component (e.g., a hardware or a software component) of the electronic device 701 coupled with the processor 720, and may perform various data processing or computations. As at least part of the data processing or computations, the processor 720 may load a command or data received from another component (e.g., the sensor module 776 or the communication module 790) in volatile memory 732, process the command or the data stored in the volatile memory 732, and store resulting data in non-volatile memory 734. The processor 720 may include a main processor 721 (e.g., a central processing unit (CPU) or an application processor (AP)), and an auxiliary processor 723 (e.g., a graphics processing unit (GPU), an image signal processor (ISP), a sensor hub processor, or a communication processor (CP)) that is operable independently from, or in conjunction with, the main processor 721. Additionally or alternatively, the auxiliary processor 723 may be adapted to consume less power than the main processor 721, or execute a particular function. The auxiliary processor 723 may be implemented as being separate from, or a part of, the main processor 721.

The auxiliary processor 723 may control at least some of the functions or states related to at least one component (e.g., the display device 760, the sensor module 776, or the communication module 790) among the components of the electronic device 701, instead of the main processor 721 while the main processor 721 is in an inactive (e.g., sleep) state, or together with the main processor 721 while the main processor 721 is in an active state (e.g., executing an application). According to one embodiment, the auxiliary processor 723 (e.g., an image signal processor or a communication processor) may be implemented as part of another component (e.g., the camera module 780 or the communication module 790) functionally related to the auxiliary processor 723.

The memory 730 may store various data used by at least one component (e.g., the processor 720 or the sensor module 776) of the electronic device 701. The various data may include, for example, software (e.g., the program 740) and input data or output data for a command related thereto. The memory 730 may include the volatile memory 732 or the non-volatile memory 734.

The program 740 may be stored in the memory 730 as software, and may include, for example, an operating system (OS) 742, middleware 744, or an application 746.

The input device 750 may receive a command or data to be used by other component (e.g., the processor 720) of the electronic device 701, from the outside (e.g., a user) of the electronic device 701. The input device 750 may include, for example, a microphone, a mouse, or a keyboard.

The sound output device 755 may output sound signals to the outside of the electronic device 701. The sound output device 755 may include, for example, a speaker or a receiver. The speaker may be used for general purposes, such as playing multimedia or recording, and the receiver may be used for receiving an incoming call. According to one embodiment, the receiver may be implemented as being separate from, or a part of, the speaker.

The display device 760 may visually provide information to the outside (e.g., a user) of the electronic device 701. The display device 760 may include, for example, a display, a hologram device, or a projector and control circuitry to control a corresponding one of the display, hologram device, and projector. According to one embodiment, the display device 760 may include touch circuitry adapted to detect a touch, or sensor circuitry (e.g., a pressure sensor) adapted to measure the intensity of force incurred by the touch.

The audio module 770 may convert a sound into an electrical signal and vice versa. According to one embodiment, the audio module 770 may obtain the sound via the input device 750, or output the sound via the sound output device 755 or a headphone of an external electronic device 702 directly (e.g., wired) or wirelessly coupled with the electronic device 701.

The sensor module 776 may detect an operational state (e.g., power or temperature) of the electronic device 701 or an environmental state (e.g., a state of a user) external to the electronic device 701, and then generate an electrical signal or data value corresponding to the detected state. The sensor module 776 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 777 may support one or more specified protocols to be used for the electronic device 701 to be coupled with the external electronic device 702 directly (e.g., wired) or wirelessly. According to one embodiment, the interface 777 may include, for example, a high definition multimedia interface (HDMI), a universal serial bus (USB) interface, a secure digital (SD) card interface, or an audio interface.

A connecting terminal 778 may include a connector via which the electronic device 701 may be physically connected with the external electronic device 702. According to one embodiment, the connecting terminal 778 may include, for example, an HDMI connector, a USB connector, an SD card connector, or an audio connector (e.g., a headphone connector).

The haptic module 779 may convert an electrical signal into a mechanical stimulus (e.g., a vibration or a movement) or an electrical stimulus which may be recognized by a user via tactile sensation or kinesthetic sensation. According to one embodiment, the haptic module 779 may include, for example, a motor, a piezoelectric element, or an electrical stimulator.

The camera module 780 may capture a still image or moving images. According to one embodiment, the camera module 780 may include one or more lenses, image sensors, image signal processors, or flashes.

The power management module 788 may manage power supplied to the electronic device 701. The power management module 788 may be implemented as at least part of, for example, a power management integrated circuit (PMIC).

The battery 789 may supply power to at least one component of the electronic device 701. According to one embodiment, the battery 789 may include, for example, a primary cell which is not rechargeable, a secondary cell which is rechargeable, or a fuel cell.

The communication module 790 may support establishing a direct (e.g., wired) communication channel or a wireless communication channel between the electronic device 701 and the external electronic device (e.g., the electronic device 702, the electronic device 704, or the server 708) and performing communication via the established communication channel. The communication module 790 may include one or more communication processors that are operable independently from the processor 720 (e.g., the AP) and supports a direct (e.g., wired) communication or a wireless communication. According to one embodiment, the communication module 790 may include a wireless communication module 792 (e.g., a cellular communication module, a short-range wireless communication module, or a global navigation satellite system (GNSS) communication module) or a wired communication module 794 (e.g., a local area network (LAN) communication module or a power line communication (PLC) module). A corresponding one of these communication modules may communicate with the external electronic device via the first network 798 (e.g., a short-range communication network, such as Bluetooth™, wireless-fidelity (Wi-Fi) direct, or a standard of the Infrared Data Association (IrDA)) or the second network 799 (e.g., a long-range communication network, such as a cellular network, the Internet, or a computer network (e.g., LAN or wide area network (WAN)). These various types of communication modules may be implemented as a single component (e.g., a single IC), or may be implemented as multiple components (e.g., multiple ICs) that are separate from each other. The wireless communication module 792 may identify and authenticate the electronic device 701 in a communication network, such as the first network 798 or the second network 799, using subscriber information (e.g., international mobile subscriber identity (IMSI)) stored in the subscriber identification module 796.

The antenna module 797 may transmit or receive a signal or power to or from the outside (e.g., the external electronic device) of the electronic device 701. According to one embodiment, the antenna module 797 may include one or more antennas, and, therefrom, at least one antenna appropriate for a communication scheme used in the communication network, such as the first network 798 or the second network 799, may be selected, for example, by the communication module 790 (e.g., the wireless communication module 792). The signal or the power may then be transmitted or received between the communication module 790 and the external electronic device via the selected at least one antenna.

At least some of the above-described components may be mutually coupled and communicate signals (e.g., commands or data) therebetween via an inter-peripheral communication scheme (e.g., a bus, a general purpose input and output (GPIO), a serial peripheral interface (SPI), or a mobile industry processor interface (MIPI)).

According to one embodiment, commands or data may be transmitted or received between the electronic device 701 and the external electronic device 704 via the server 708 coupled with the second network 799. Each of the electronic devices 702 and 704 may be a device of a same type as, or a different type, from the electronic device 701. All or some of operations to be executed at the electronic device 701 may be executed at one or more of the external electronic devices 702, 704, or 708. For example, if the electronic device 701 should perform a function or a service automatically, or in response to a request from a user or another device, the electronic device 701, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 701. The electronic device 701 may provide the outcome, with or without further processing of the outcome, as at least part of a reply to the request. To that end, a cloud computing, distributed computing, or client-server computing technology may be used, for example.

One embodiment may be implemented as software (e.g., the program 740) including one or more instructions that are stored in a storage medium (e.g., internal memory 736 or external memory 738) that is readable by a machine (e.g., the electronic device 701). For example, a processor of the electronic device 701 may invoke at least one of the one or more instructions stored in the storage medium, and execute it, with or without using one or more other components under the control of the processor. Thus, a machine may be operated to perform at least one function according to the at least one instruction invoked. The one or more instructions may include code generated by a complier or code executable by an interpreter. A machine-readable storage medium may be provided in the form of a non-transitory storage medium. The term "non-transitory" indicates that the storage medium is a tangible device, and does not include a signal (e.g., an electromagnetic wave), but this term does not differentiate between where data is semi-permanently stored in the storage medium and where the data is temporarily stored in the storage medium.

According to one embodiment, a method of the disclosure may be included and provided in a computer program product. The computer program product may be traded as a product between a seller and a buyer. The computer program product may be distributed in the form of a machine-readable storage medium (e.g., a compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to one embodiment, each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In this case, the integrated component may still perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

Although certain embodiments of the present disclosure have been described in the detailed description of the present disclosure, the present disclosure may be modified in various forms without departing from the scope of the present disclosure. Thus, the scope of the present disclosure shall not be determined merely based on the described embodiments, but rather determined based on the accompanying claims and equivalents thereto.

What is claimed is:

1. An electronic circuit, comprising:
    a directional coupler;
    a sense pair connected to the directional coupler, wherein the sense pair includes a first sensing path, a second sensing path, and a reference path; and
    an analog-to-digital converter (ADC) connected to the sense pair,
    wherein the ADC directly digitizes a signal current received from the sense pair.

2. The electronic circuit of claim 1, wherein the ADC is a current-mode ADC.

3. The electronic circuit of claim 1, wherein the ADC is a successive approximation register (SAR) ADC.

4. The electronic circuit of claim 3, wherein the SAR ADC includes an SAR engine and a digital-to-analog converter (DAC) connected to the SAR engine.

5. The electronic circuit of claim 1, wherein the ADC directly digitizes the signal current without a current-to-voltage conversion.

6. The electronic circuit of claim 1, wherein the first sensing path is configured to sense current from the directional coupler.

7. The electronic circuit of claim 1, wherein the second sending path is configured to sense current from isolation (ISO).

8. The electronic circuit of claim 1, wherein the directional coupler is configured to couple power delivered to an antenna to an input of the sense pair.

9. The electronic circuit of claim 1, wherein the ADC includes a sample-and-hold switch cap.

10. A method, comprising:
    coupling, with a directional coupler, power delivered to an antenna to an input of a sense pair, wherein the sense pair includes a first sensing path, a second sensing path, and a reference path;
    converting, with the sense pair, the delivered power to direct current (DC) currents which indicate a power sensed at ports of the coupler; and
    directly digitizing, with an analog-to-digital converter (ADC), the converted currents from the sense pair.

11. The method of claim 10, wherein the ADC is a current-mode ADC.

12. The method of claim 10, wherein the ADC is a successive approximation register (SAR) ADC.

13. The method of claim 12, wherein the SAR ADC includes an SAR engine and a digital-to-analog converter (DAC) connected to the SAR engine.

14. The method of claim 10, wherein the ADC directly digitizes the signal current without a current-to-voltage conversion.

15. The method of claim 10, wherein the first sensing path is configured to sense current from the directional coupler.

16. The method of claim 10, wherein the second sending path is configured to sense current from isolation (ISO).

17. The method of claim 10, wherein the ADC includes a sample-and-hold switch cap.

18. The method of claim 17, wherein the sample-and-hold switch includes a unity-gain buffer.

* * * * *